US007728615B2

(12) United States Patent
Koishi

(10) Patent No.: US 7,728,615 B2
(45) Date of Patent: Jun. 1, 2010

(54) TEST APPARATUS THAT TESTS A DEVICE UNDER TEST AND CONNECTING APPARATUS THAT CONNECTS A FIRST APPARATUS AND A SECOND APPARATUS

(75) Inventor: Tetsuya Koishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 111 days.

(21) Appl. No.: 12/047,330

(22) Filed: Mar. 13, 2008

(65) Prior Publication Data

US 2009/0066340 A1    Mar. 12, 2009

(30) Foreign Application Priority Data

Mar. 15, 2007    (JP)    ............................. 2007-066723

(51) Int. Cl.
*G01R 31/02* (2006.01)
(52) U.S. Cl. ...................................... 324/765; 324/755
(58) Field of Classification Search ........................ None
See application file for complete search history.

(56) References Cited

U.S. PATENT DOCUMENTS 5,295,853 A * 3/1994 Nagakusa et al. ........... 439/330
5,654,631 A * 8/1997 Ames ...................... 324/158.1

FOREIGN PATENT DOCUMENTS

JP    2002-257908    9/2002

* cited by examiner

*Primary Examiner*—Minh N Tang
(74) *Attorney, Agent, or Firm*—Osha • Liang LLP

(57) ABSTRACT

Provided is a test apparatus that tests a device under test, including a test head that generates a test signal for testing the device under test; a socket board onto which is mounted the device under test, that transmits signals between the test head and the device under test; a plurality of actuators that are disposed on a lower surface of the socket board to correspond one-to-one with support positions thereof, and that each have a state thereof changed according to a control signal supplied thereto to independently move the corresponding support position in a direction vertical to the lower surface of the socket board; and a connection control section that supplies a first control signal to each actuator to set each actuator to be in the same state, and thereafter supplies commonly to each actuator a second control signal that gradually decreases an apparatus separation distance between the socket board and the test head.

26 Claims, 9 Drawing Sheets

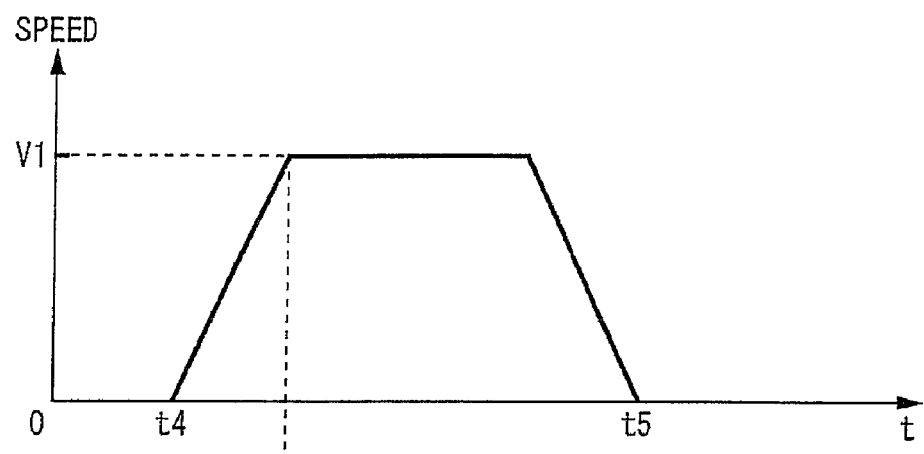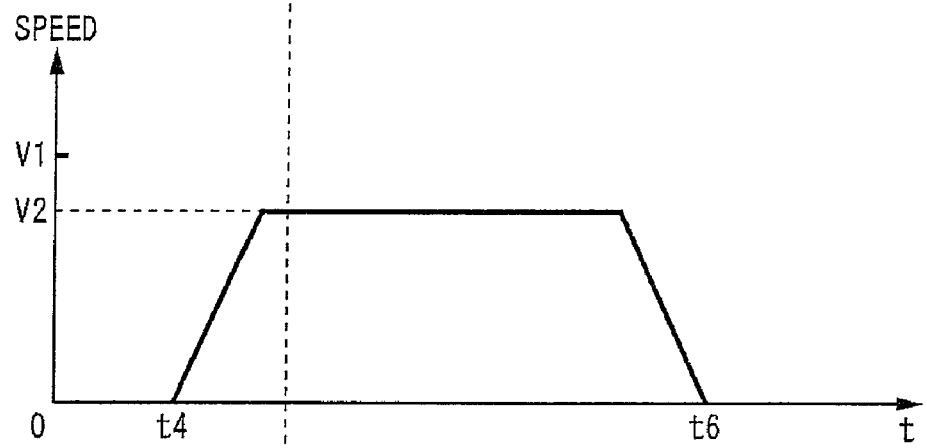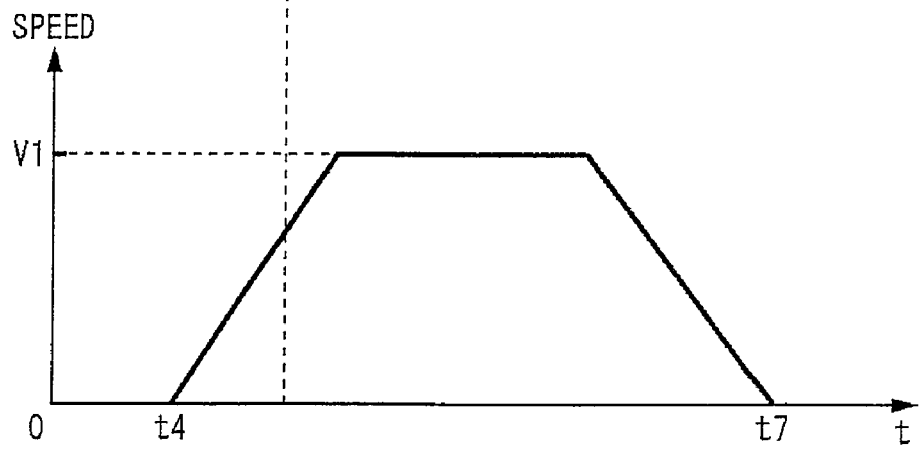
FIG. 9

TEST APPARATUS THAT TESTS A DEVICE UNDER TEST AND CONNECTING APPARATUS THAT CONNECTS A FIRST APPARATUS AND A SECOND APPARATUS

CROSS REFERENCE TO RELATED APPLICATION

The present application claims priority from a Japanese Patent Application No. 2007-066723 filed on Mar. 15, 2007, the contents of which are incorporated herein by reference.

BACKGROUND

1. Technical Field

The present invention relates to a test apparatus and a connecting apparatus. In particular, the present invention relates to a test apparatus that tests a device under test and to a connecting apparatus that connects a first apparatus and a second apparatus.

2. Related Art

A test apparatus that tests a device under test such as a semiconductor chip may include a socket board onto which the device under test is mounted and a test head that supplies a test signal to the device under test. The socket board is detachably mounted on the test head.

When the device under test is tested, the socket board is mounted at a prescribed position on the test head. The test head is thereby electrically connected to the device under test via the socket board.

The test head is provided with air cylinders at four positions and the socket board is supported at tops of rods of the air cylinders. When the socket board is connected to the test head, the rods are driven by vacuum suction in the air cylinders, as disclosed, for example, in Japanese Patent Application Publication No. 2002-257908.

The socket board desirably moves in a vertical direction in relation to the test head while remaining parallel to the test head. By doing this, male terminals of a connector can be attached to or removed from female terminals vertically. When the socket board and the test head are connected to each other by vacuum suction, however, an uneven driving force between each air cylinder may arise. If such a problem occurs, the socket board might not remain parallel to the test head when moving.

Furthermore, when the socket board and the test head are connected by vacuum suction, it is difficult to adjust a movement speed of the socket board. It is desirable that an impact occurring when the socket board is connected to the test head be as small as possible. When the connection method involves vacuum suction, however, it is difficult to control the movement speed of the socket board, which can result in a relatively large impact when the socket board and the test head are connected.

SUMMARY

Therefore, it is an object of an aspect of the innovations herein to provide a test apparatus and a connecting apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus that tests a device under test, including a test head that generates a test signal for testing the device under test; a socket board onto which is mounted the device under test, that transmits signals between the test head and the device under test; a plurality of actuators that are disposed on a lower surface of the socket board to correspond one-to-one with support positions thereof, and that each have a state thereof changed according to a control signal supplied thereto to independently move the corresponding support position in a direction vertical to the lower surface of the socket board; and a connection control section that supplies a first control signal to each actuator to set each actuator to be in the same state, and thereafter supplies commonly to each actuator a second control signal that gradually decreases an apparatus separation distance between the socket board and the test head.

According to a second aspect related to the innovations herein, one exemplary apparatus may include a connecting apparatus that connects a first apparatus and a second apparatus, including a plurality of actuators that are disposed on a lower surface of the first apparatus to correspond one-to-one with support positions thereof, and that each have a state thereof changed according to a control signal supplied thereto to independently move the corresponding support position in a direction to the lower surface of the first apparatus; and a connection control section that supplies a first control signal to each actuator to set each actuator to be in the same state, and thereafter supplies commonly to each actuator a second control signal that gradually decreases an apparatus separation distance between the first apparatus and the second apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9 shows examples of pulse output patterns supplied to the integrated control section 52.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
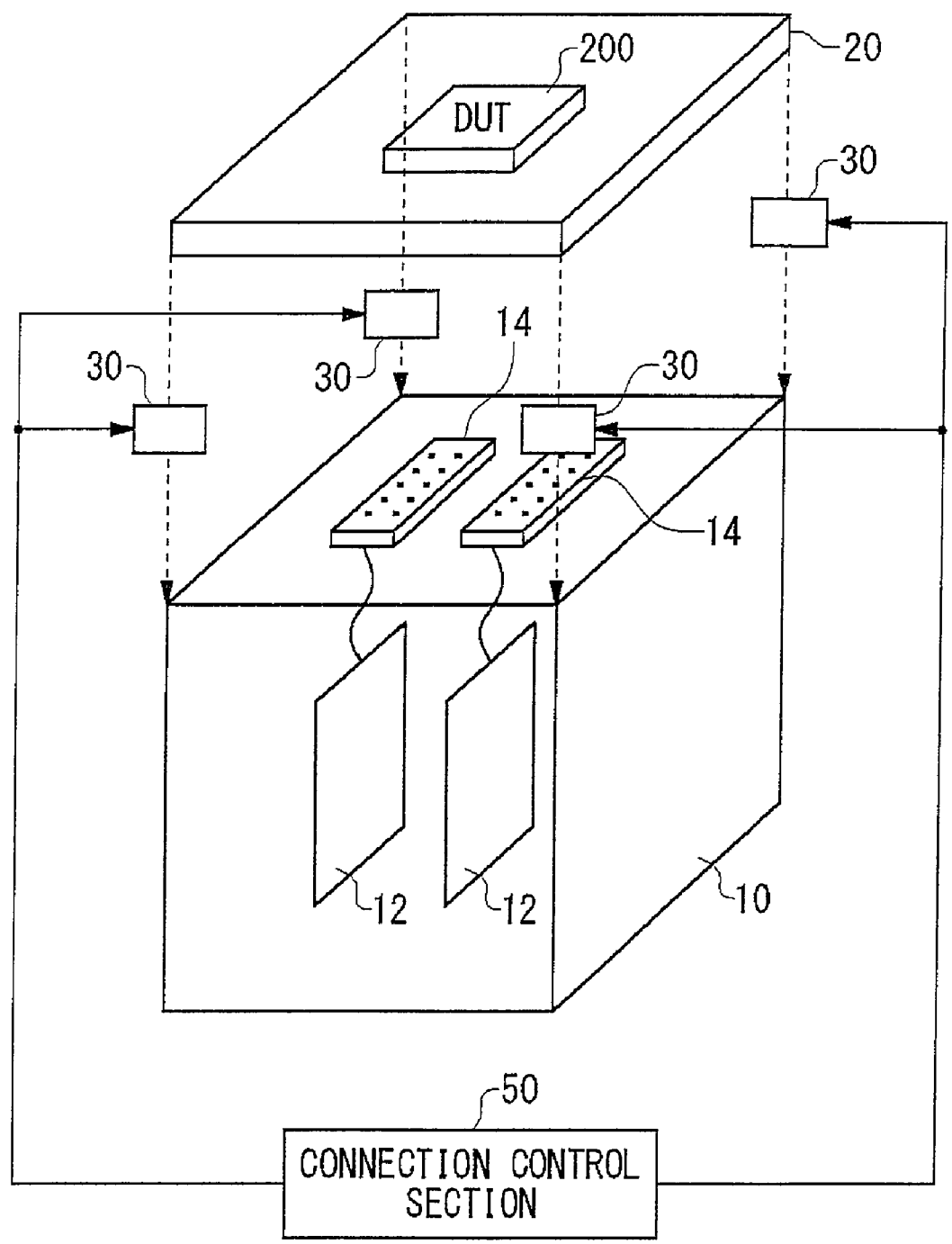
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200 such as a semiconductor chip, and is provided with a test head 10, a socket board 20, a plurality of actuators 30, and a connection control section 50.

The device under test 200 is mounted on the socket board 20. A socket for holding the device under test 200 may be disposed on an upper surface of the socket board 20. The socket board 20 transmits signals between the device under test 200 and the test head 10. For example, the aforementioned socket may include terminals that connect electrically to the pins of the device under test 200, respectively.

Connectors that are electrically connected to the pins of the device under test 200 may be disposed on a lower surface of the socket board 20. The test head 10 and the device under test 200 may be electrically connected by connecting these connectors to the connectors disposed on the test head 10. Here, the lower surface of the socket board 20 may face the test head 10, and the upper surface of the socket board 20 may refer to a back surface of the aforementioned lower surface.

The test head 10 tests the device under test 200 by sending signals to and receiving signals from the device under test 200. For example, the test head 10 may input into the device under test 200 a signal causing the device under test 200 to operate, and may make a judgment concerning pass/fail of the device under test 200 based on a signal output by the device under test 200.

The test head 10 may include a plurality of test boards 12 and a plurality of connectors 14. The plurality of test boards 12 are disposed in the test head 10, generate the signal to be supplied to the device under test 200, and make a judgment concerning pass/fail of the device under test 200 based on the signal output by the device under test 200. The connectors 14 are disposed on an upper surface of the test head 10 and are electrically connected to the socket board 20. The upper surface of the test head 10 may face the lower surface of the socket board 20.

For example, when performing a functional test of the device under test 200, the test head 10 may input a test signal having a prescribed logic pattern into the device under test 200 and make a judgment concerning pass/fail of the device under test 200 by comparing the logic pattern of the signal output by the device under test 200 to an expected value pattern.

When performing a DC test of the device under test 200, the test head 10 may make a judgment concerning pass/fail of the device under test 200 based on a power supply voltage or a power supply current supplied to the device under test 200 at a time when the device under test 200 is operating and at a time when the device under test 200 is not operating. The type of testing performed by the test apparatus 100 is not limited to the functional test and the DC test described above. The test apparatus 100 can perform various tests based on electrical characteristics of the device under test 200.

The plurality of actuators 30 and the connection control section 50 function as a connecting apparatus that connects a first apparatus to a second apparatus. In the present embodiment, the first apparatus is the socket board 20 and the second apparatus is the test head 10. The connecting apparatus can be used for various apparatuses besides the test apparatus 100.

The plurality of actuators 30 are disposed to correspond to the support positions on the lower surface of the socket board 20. In the present embodiment, the lower surface of the socket board 20 has a square shape, and four actuators 30 are positioned in a vicinity of the corners thereof to support the socket board 20. Each actuator 30 may be fixed on the upper surface of the test head 10 at a position that corresponds with a position at which the socket board 20 is supported. For example, in a case where the upper surface of the test head 10 and the lower surface of the socket board 20 both have the same square shape, the actuators 30 are disposed in a vicinity of the corners of the upper surface of the test head 10.

Each actuator 30 can independently raise and lower the corresponding support position of the socket board 20 by having a state thereof changed according to a control signal supplied thereto. Each actuator 30 may move the socket board 20 up and down, that is, in a direction vertical to the lower surface of the socket board 20, by driving a motor or the like according to an electrical control signal. For example, in a case where the socket board 20 connects to the test head 10, the actuators 30 may move the socket board 20 in a direction of the test head 10, e.g. a downward direction. When the socket board 20 is unattached from the test head 10, the socket board 20 moves in a direction to be separated from the test head 10, e.g. an upward direction.

The connection control section 50 causes the actuators 30 to operate by supplying the control signal to each of the actuators 30. The connection control section 50 may supply a control signal independently to each of the actuators 30.

When the socket board 20 connects to the test head 10, the connection control section 50 supplies a first control signal to each actuator 30 such that the state of each actuator 30 becomes identical (referred to hereinafter as the "initial state"). Each first control signal supplied to each actuator 30 may be a different signal. Furthermore, the connection control section 50 may supply the different first control signals to each actuator 30 in parallel. Here, the identical state to which each actuator 30 is set may refer to a state in which a distance between the support position of the socket board 20 corresponding to each actuator 30 and the test head 10 (refereed to hereinafter as the "apparatus separation distance") is identical, and also in which the amount of change in the apparatus separation distance when the same control signals are received in the state described above is identical.

After each actuator 30 is set to the same initial state, the connection control section 50 supplies a second control signal, which gradually decreases the apparatus separation distance between the socket board 20 and the test head 10, to each actuator 30 in common. Each second control signal supplied to each actuator 30 may be a different signal. Furthermore, the connection control section 50 may supply the different second control signals to each actuator 30 in parallel.

When the apparatus separation distance between the socket board 20 and the test head 10 reaches a prescribed connection distance, the connection control section 50 simultaneously stops the supply of each second control signal to the respective actuator 30. By individually controlling each actuator 30 in this manner, each actuator 30 can be set to the same initial state. After each actuator 30 is set to the same initial state, the socket board 20 and the test head 10 are held parallel to each other in order to be connected by controlling each actuator 30 commonly, so that, in such a state, the socket board 20 can be connected to the test head 10.

Figure 2:
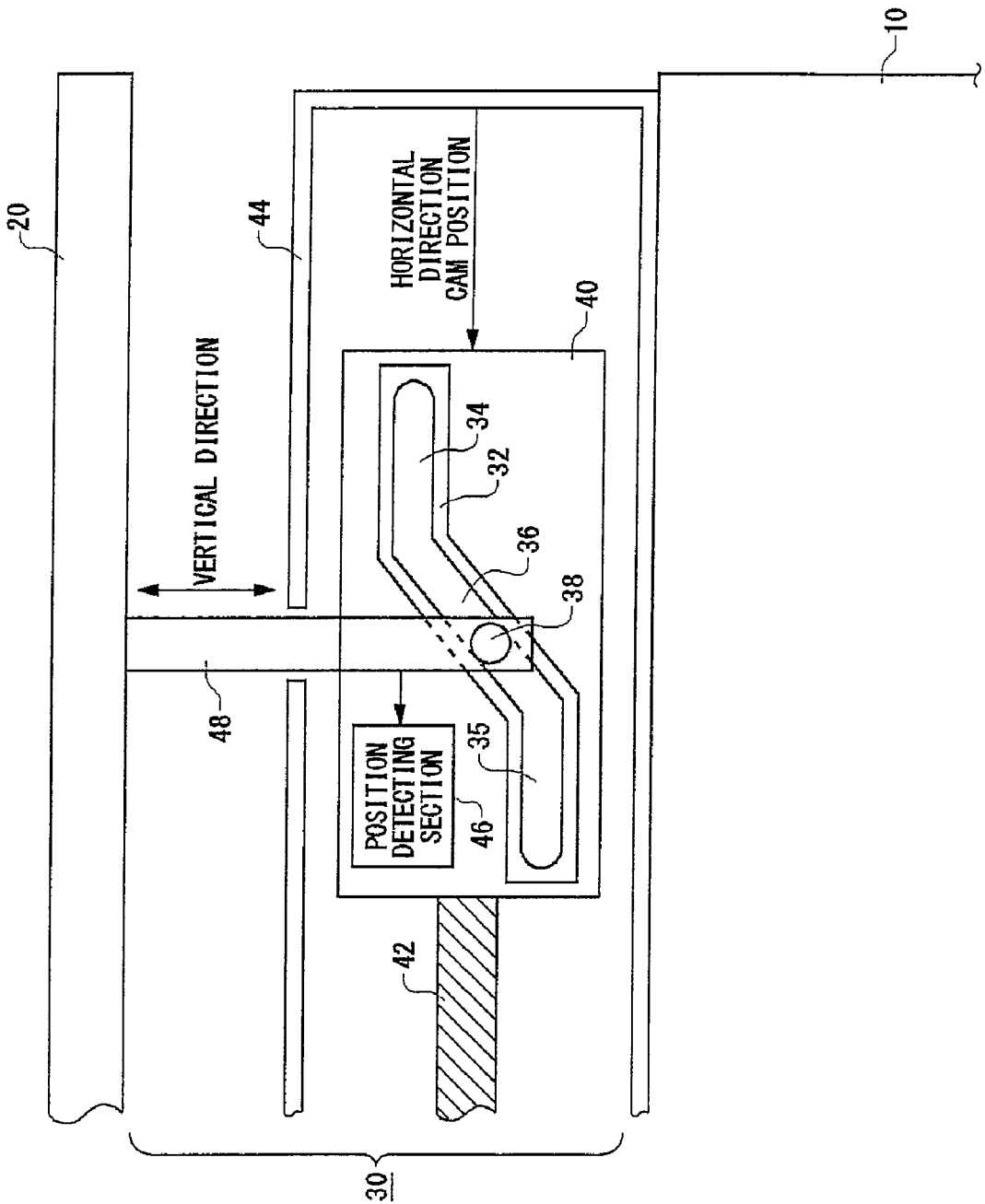
FIG. 2 shows an exemplary configuration of one of the actuators 30.

FIG. 2 shows an exemplary configuration of one of the actuators 30. Each actuator 30 has the same configuration. FIG. 2 uses a cross-sectional view of the actuator 30 to describe the configuration thereof. The actuator 30 includes a cylinder 44 and a moving section 48.

One end of the moving section 48 is connected to a corresponding support position of the socket board 20, and the other end is connected to the cylinder 44. The moving section 48 moves in a direction vertical to the upper surface of the test head 10, e.g. an up and down direction, to control the apparatus separation distance between the test head 10 and the corresponding support position of the socket board 20. For example, the moving section 48 is a rod-shaped component formed in a manner to extend in the aforementioned vertical direction, and is disposed in a manner to be inserted into an aperture formed in the upper surface of the cylinder 44. The aperture may be formed in the upper surface of the cylinder 44 at a position corresponding to the support position of the socket board 20.

The state of the cylinder 44 changes according to the control signal supplied thereto to move the moving section 48 up and down. The cylinder 44 may be disposed by being fixed on the upper surface of the test head 10. The cylinder 44 includes therein a cam 32, a substrate 40, and a cam driving section 42. The cam driving section 42 operates the cam 32 according to the control signal supplied thereto. By doing this, the state of the cylinder 44 is changed to move the moving section 48 up and down.

The cam 32 is disposed in a manner to be movable in a horizontal direction, e.g. a left and right direction) in relation to the upper surface of the test head 10. A grooved portion is formed in the cam 32 to allow a sliding section 38 of the moving section 48 to slide. The sliding section 38 may be disposed in proximity to an end portion of the moving section 48, and may be inserted into the grooved portion in a slideable manner.

The cam 32 includes a first horizontal section 34, a second horizontal section 35, and a junction section 36. The first horizontal section 34, the second horizontal section 35, and the junction section 36 are each formed with the grooved portion running therethrough. The grooved portion of the first horizontal section 34 is formed in a region separated from the upper surface of the test head 10 by a first distance, and extends in a horizontal direction in relation to the upper surface of the test head 10. The grooved portion of the second horizontal section 35 is formed in a region separated from the upper surface of the test head 10 by a second distance, and extends in a horizontal direction in relation to the upper surface of the test head 10. The second distance may be less than the first distance, for example, as shown in FIG. 2.

The junction section 36 is disposed between the first horizontal section 34 and the second horizontal section 35. The first horizontal section 34, the second horizontal section 35, and the junction section 36 may be form in an integrated manner. The grooved portion of the junction section 36 connects the grooved portion of the first horizontal section 34 and the grooved portion of the second horizontal section 35, and is formed at an angle in relation to the upper surface of the test head 10. In other words, one end of the grooved portion of the junction section 36 is formed to be continuous with the grooved portion of the first horizontal section 34, and the other end of the grooved portion of the junction section 36 is formed to be continuous with the grooved portion of the second horizontal section 35. The junction section 36 may be formed to extend linearly to the grooved portions formed in the first horizontal section 34 and the second horizontal section 35.

By moving the cam 32 described above horizontally, the sliding section 38 moves vertically along the grooved portions, so that the moving section 48 can move in a vertical direction. It should be noted that when the sliding section 38 slides in the grooved portions of the first horizontal section 34 or the second horizontal section 35, the distance between the sliding section 38 and the test head 10 does not change, but when the sliding section 38 slides in the grooved portion of the junction section 36, the moving section 48 moves in a vertical direction.

The substrate 40 supports the cam 32. The substrate 40 may support the cam 32 such that the shape of the cam 32 does not deform. For example, a prescribed external shape of the surfaces of the substrate 40 may be larger than the external shape of the cam 32, as shown in FIG. 2. The cam 32 may be formed on the upper surface of the substrate 40.

The cam driving section 42 moves the cam 32 in a horizontal direction according to the control signal supplied thereto. The cam driving section 42 of the present embodiment moves the cam 32 in a horizontal direction by moving the substrate 40 in a horizontal direction. The cam driving section 42 may move the cam 32 a prescribed amount every time a single pulse included in the control signal is received.

The position detecting section 46 detects whether the state of the cylinder 44 is the same as the predetermined initial state. For example, the position detecting section 46 may detect whether the vertical position of the moving section 48 is the same as the initial position corresponding to the initial state, and may detect whether the horizontal position of the cam 32 or the substrate 40 is the same as the initial position corresponding to the initial state. In the manner described above, the connection control section 50 independently supplies the first control signals, which change the state of each cylinder 44, until the state of each cylinder 44 is set to the initial state as determined by the position detecting section 46 of each cylinder 44.

Furthermore, the position detecting section 46 detects whether the state of the cylinder 44 is the same as the predetermined connection state. The connection state may refer to a state of the cylinder 44 at a time when the apparatus separation distance between the socket board 20 and the test head 10 reaches a distance at which the socket board 20 and the test head 10 are connected. For example, the position detecting section 46 may detect whether the vertical position of the moving section 48, the horizontal position of the cam 32, or the horizontal position of the substrate 40 is the same as a connection position corresponding to a connection state. The connection control section 50 may stop supplying the second control signal to all of the actuators 30 when the state of all the cylinders 44 has become the same as the connection state.

The initial state of the cylinder 44 may be a state in which the sliding section 38 is positioned at an end of the grooved portion of the junction section 36 on the first horizontal section 34 side, for example. The connection state of the cylinder 44 may be a state in which the sliding section 38 is positioned at an end of the grooved portion of the junction section 36 on the second horizontal section 35 side, for example.

In the manner described above, by disposing the first horizontal section 34 and the second horizontal section 35 at the ends of the junction section 36, respectively, an excessive pushing force between the socket board 20 and the test head 10 can be prevented, even in a case where the second control signal is further supplied to a cylinder 44 that has already reached the connection state. In the same manner, malfunctioning of the cam driving section 42 can be prevented because the cam 32 moves in a horizontal direction in a case where the second control signal is further supplied to a cylinder 44 that has already reached the connection state.

Figure 3:
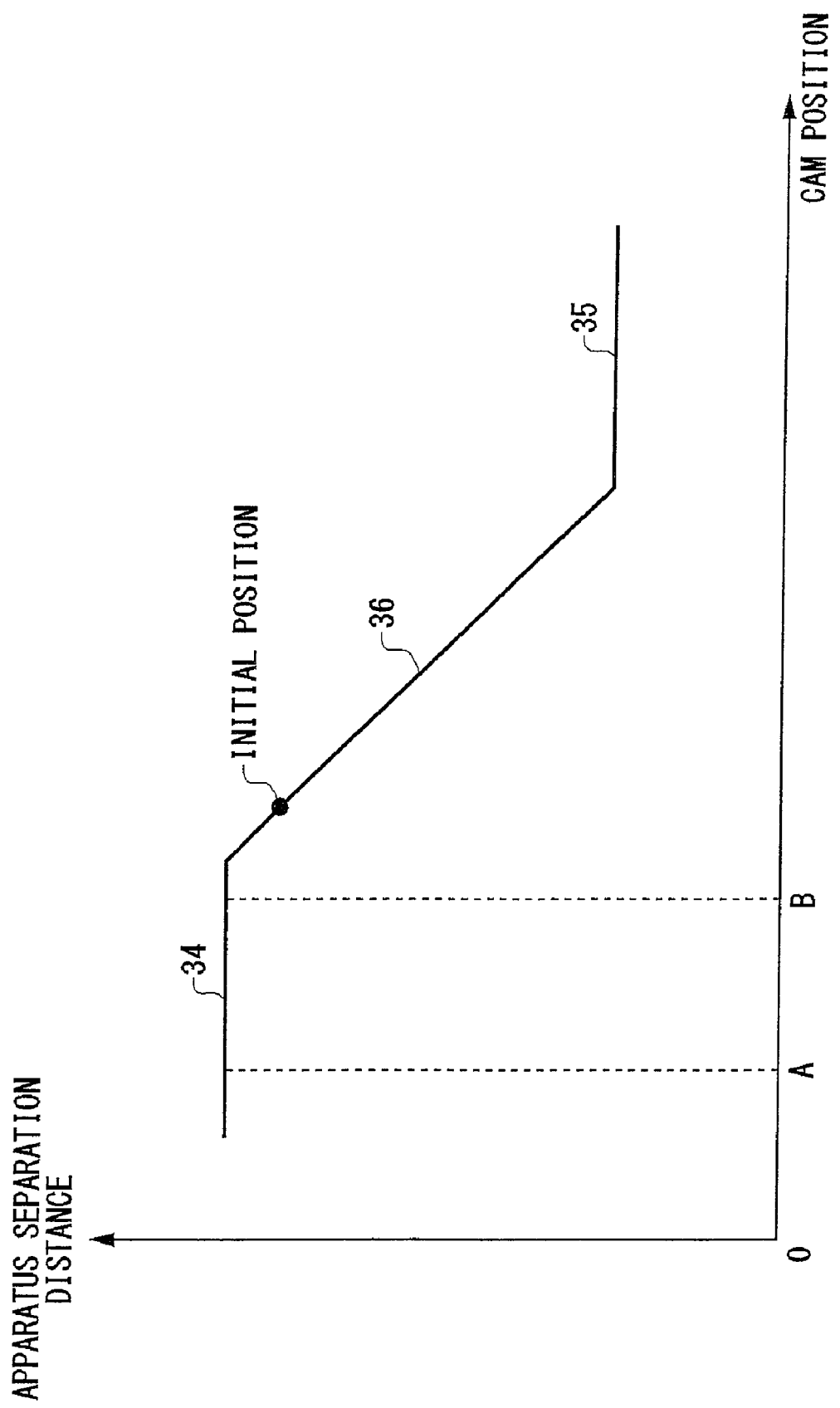
FIG. 3 shows an exemplary operation of the actuator 30.

FIG. 3 shows an exemplary operation of the actuator 30. In FIG. 3, the horizontal axis represents the position of the cam 32 in a horizontal direction, and the vertical axis represents the apparatus separation distance between the test head 10 and the socket board 20 in a vertical direction.

As described in FIG. 2, the apparatus separation distance remains the same when the cam is at different positions in the regions corresponding to the first horizontal section 34 and the second horizontal section 35, respectively. For example, when replacing the socket board 20, the socket board 20 is replaced at a state in which the apparatus separation distance between the socket board 20 and the test head 10 is at the maximum. At this time, there are cases where the position of the cam of each actuator 30 is different, as shown in state A and state B of FIG. 3.

Even when the same second control signal for newly connecting the socket board 20 and the test head 10 is supplied in parallel to the actuators 30 in the states described above, there are cases where the actuator 30 at the state B begins to move the moving section 48 in a vertical direction at a time earlier than when the actuator 30 at the state A begins to move the moving section 48, so that the socket board 20 cannot be held parallel to the test head 10.

In response to this problem, the connection control section 50 of the present embodiment, before supplying the second control signal in parallel to each actuator 30, independently supplies each actuator 30 with the first control signal that sets the state of each actuator 30 to be the same initial state.

For example, the connection control section 50 controls each actuator 30 such that the position of the cam 32 of each actuator 30 becomes the same initial position. More specifically, the connection control section 50 supplies in parallel to the actuators 30, whose states are indicated by A and B in FIG. 3, the first control signals causing the cam position to move in the same direction, e.g. a direction that is to the left in FIG. 2. The connection control section 50 sequentially stops the supply of the first control signals to actuators 30 in which the cam position has reached the initial position. Here, the initial position is set to be within a range of position of the cam 32 when the sliding section 38 disposed at one end of the moving section 48 slides in the grooved portion of the junction section 36. As described above, the initial position may be set to be in proximity to a border between the junction section 36 and the first horizontal section 34.

In this manner, when the second control signal is supplied in parallel to each actuator 30 to connect the socket board 20 and the test head 10, the socket board 20 can be connected to the test head 10 while being held parallel thereto because each actuator 30 has been set to the predetermined initial state.

Figure 4:
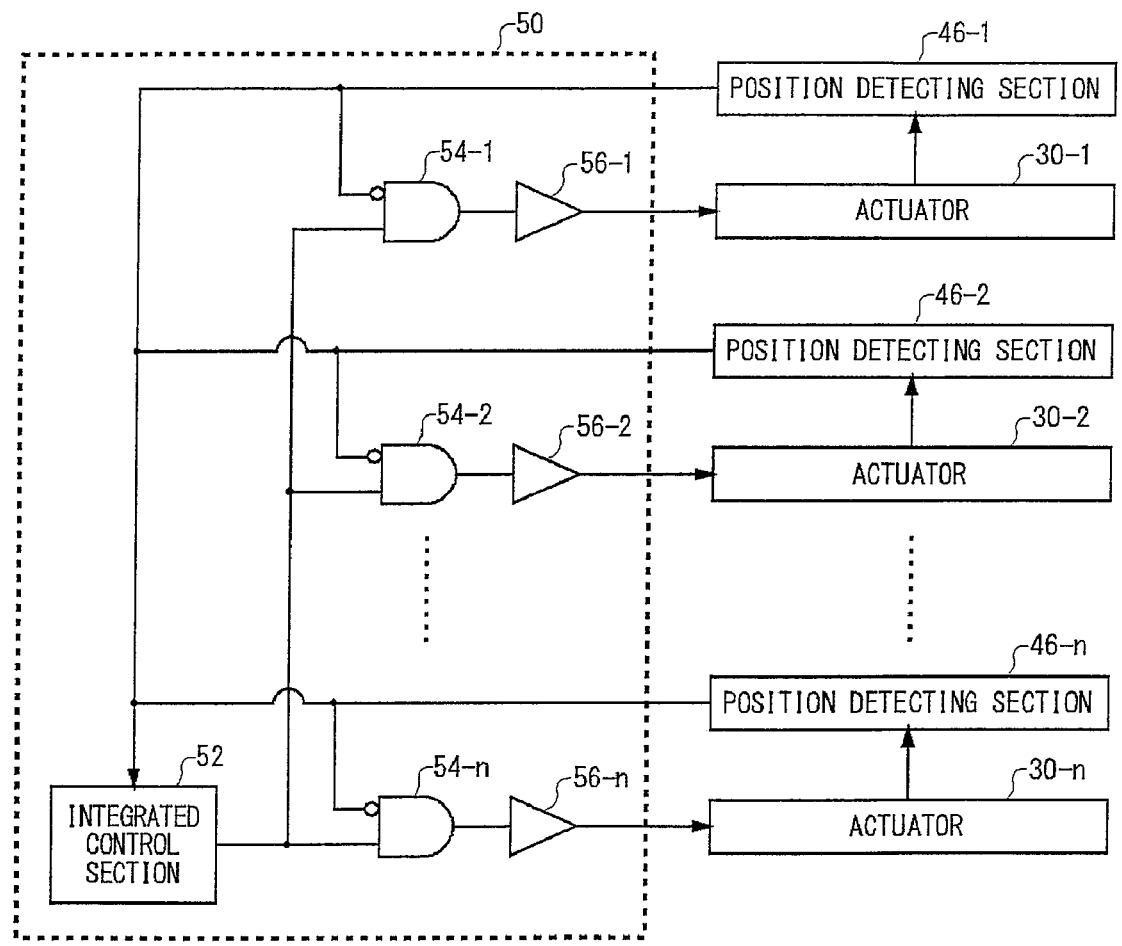
FIG. 4 shows an exemplary configuration of the connection control section 50.

FIG. 4 shows an exemplary configuration of the connection control section 50. The connection control section 50 includes an integrated control section 52, a plurality of individual control sections 54, and a plurality of drivers 56. The integrated control section 52 generates the first control signal and the second control signal in common for each actuator 30. Furthermore, the integrated control section 52 may sequentially output, as the control signal, pulses that each change the position of the cam 32 by a prescribed unit movement amount.

The plurality of individual control sections 54 are disposed to correspond one-to-one with the plurality of actuators 30. Each individual control section 54 receives the control signal output by the integrated control section 52 in a branching manner and switches whether the received control signal is supplied to the corresponding actuator 30. The plurality of drivers 56 are disposed to correspond one-to-one with the plurality of individual control sections 54. Each driver 56 may adjust the waveform of the control signal output by the corresponding individual control section 54 and supply the adjusted control signal to the cylinder 44 of the corresponding actuator 30.

When the integrated control section 52 outputs the first control signal, each individual control section 54 stops supplying the first control signal to the cylinder 44 of the corresponding actuator 30 at a time when the state of the corresponding actuator 30 becomes the same as the predetermined initial state. Each individual control section 54 may be an AND circuit that outputs an AND of the control signal output by the integrated control section 52 and a detection signal output by the corresponding position detecting section 46. The individual control section 54 of the present embodiment outputs the AND of the control signal and an inverted signal of the detection signal. Furthermore, each position detecting section 46 outputs an initial state detection signal that is logic H when the corresponding actuator 30 is at the initial state. By doing this, each individual control section 54 masks the pulse of the first control signal when the corresponding position detecting section 46 has output the initial state detection signal.

When the integrated control section 52 outputs the second control signal, each individual control section 54 may transmit the second control signal to supply the second control signal to the corresponding actuator 30. The integrated control section 52 may supply the second control signal commonly to all of the actuators 30 on condition that the state of all the actuators 30 is the same as the initial state.

The integrated control section 52 of the present embodiment begins outputting the second control signal on a condition that all of the position detecting sections 46 output initial state detection signals that are logic H. Furthermore, when outputting the second control signal, the integrated control section 52 controls in advance the logic value of the detection signal output by each position detecting section 46 to be logic L. Each position detecting section 46 may output a connection state detection signal that is logic H when the state of the corresponding actuator 30 is the same as the connection state.

Figure 5:
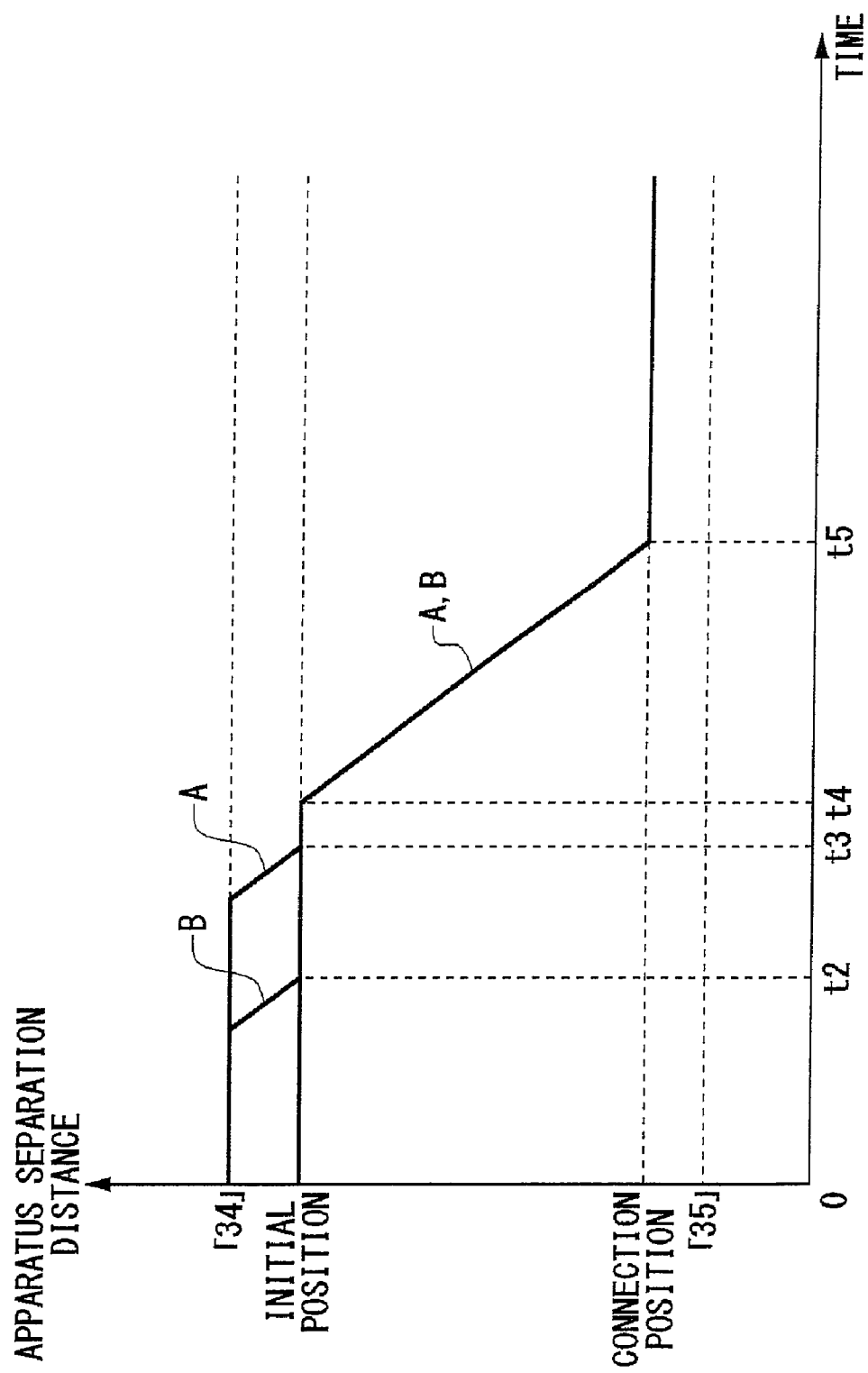
FIG. 5 shows an exemplary operation of the test apparatus 100.

FIG. 5 shows an exemplary operation of the test apparatus 100. The present embodiment describes a case in which actuators 30 at state A and state B shown in FIG. 3 are present. In other words, a case is described in which each sliding section 38 is in the region corresponding to the first horizontal section 34.

First, the integrated control section 52 outputs the first control signal that moves the position of the cam of each actuator 30 in the same direction. In the present embodiment, the integrated control section 52 outputs the first control signal that moves the cam 32 in a direction that decreases the apparatus separation distance. At this time, the individual control sections 54 supply the first control signal to the corresponding actuator 30 because the position of the cam of each actuator 30 is not the same as the initial position.

When the position of the cam of the actuator 30 at state B reaches the initial position, the corresponding individual control section 54 stops the supply of the first control signal to the actuator 30 (t2). Thereafter, at a time when the position of the cam of the actuator 30 at state A reaches the initial position, the corresponding individual control section 54 stops the supply of the first control signal to the actuator 30 (t3).

When the positions of the cams of all of the actuators 30 have reached the initial position, the integrated control section 52 outputs the second control signal. At this time, each individual control section 54 transmits the second control signal to supply the second control signal to the corresponding actuator 30 (t4). The integrated control section 52 and the individual control sections 54 supply the second control signal to the actuators 30 until the socket board 20 and the test head 10 reach the connection state (t5).

For example, the integrated control section 52 may output the second control signal having a predetermined number of pulses. The amount of change in the apparatus separation distance for each pulse and the apparatus separation distance at the initial state can be set in advance, so that the number of pulses necessary to connect the socket board 20 and the test head 10 can be set in advance. For example, the integrated control section 52 may output the second control signal having a number of pulses set in advance by a user or the like. As another possibility, the integrated control section 52 may output pulses as the second control signal until all of the position detecting sections 46 detect that the connection state has been reached.

According to test apparatus 100 of the present embodiment, even if, as shown in FIG. 5, the actuators 30 at different states A and B are present, the apparatus separation distance between the test head 10 and each support position of the socket board 20 is the same when the socket board 20 and the test head 10 are connected (t4-t5).

Figure 6:
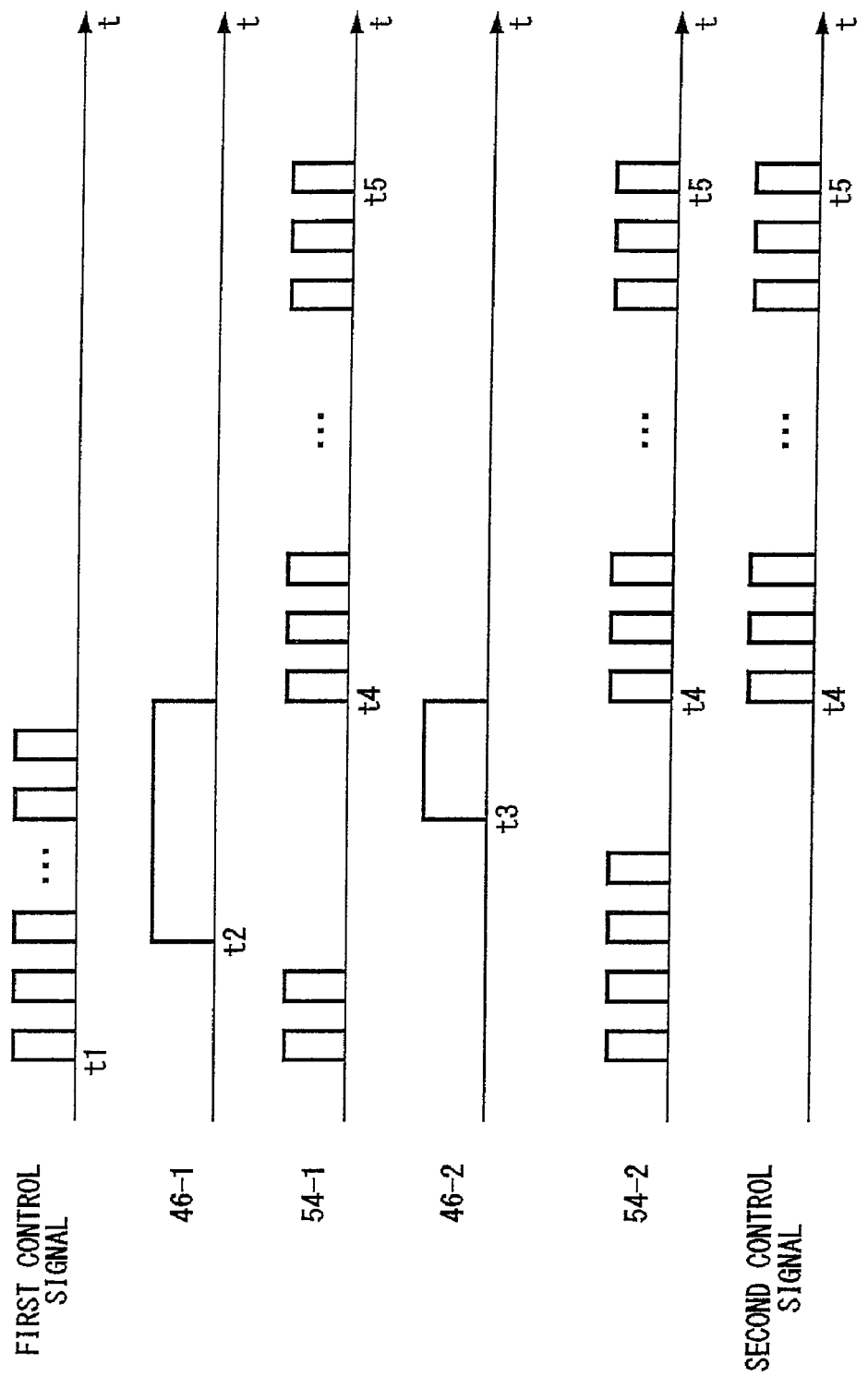
FIG. 6 is a timing chart showing an exemplary operation of the connection control section 50.

FIG. 6 is a timing chart showing an exemplary operation of the connection control section 50. Two actuators 30 are controlled in the present embodiment, but the same control can be performed for a larger number of actuators 30.

As described above, the integrated control section 52 commonly generates the first control signal. The integrated control section 52 sequentially outputs, as the first control signal, pulses that each change the position of the cam of each cylinder 44 by a unit amount.

Each position detecting section 46 outputs the initial state detection signal that is logic H when the state of the corresponding actuator 30 is the same as the initial state. Each individual control section 54 masks the first control signal with the detection signal output by the corresponding position detecting section 46.

The integrated control section 52 outputs the second control signal on a condition that all of the position detecting sections 46 output the initial state detection signal that is logic H. At this time, the integrated control section 52 controls the logic value of the detection signal output by each position detecting section 46 to be logic L. As described above, the integrated control section 52 may output the second control signal having a predetermined number of pulses. Through such an operation, the socket board 20 and the test head 10 can be connected to each other. The integrated control section 52 may be supplied in advance with a pulse pattern to be output as the second control signal (referred to hereinafter as the "pulse output pattern").

Figure 7:
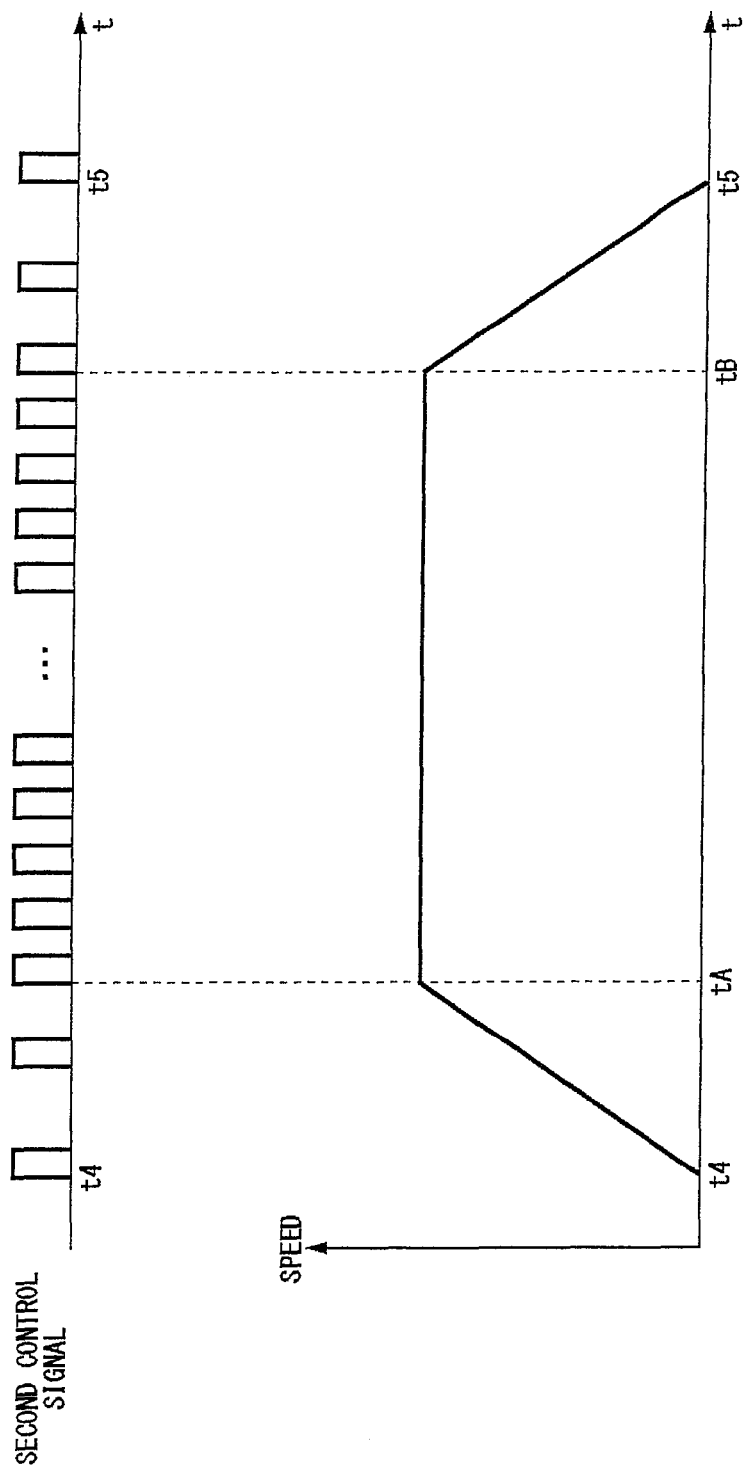
FIG. 7A shows an example of the pulse output pattern.
FIG. 7B shows an example of movement speed of the socket board 20.

FIG. 7A shows an example of the pulse output pattern. As shown in FIG. 7A, the integrated control section 52 may be provided with a pulse output pattern in which the cycle of the pulse of the second control signal become gradually shorter within a predetermined time period t4-tA from when output of the second control signal begins. Furthermore, as shown in FIG. 7A, the integrated control section 52 may be provided with a pulse output pattern in which the cycle of the pulse of the second control signal becomes gradually longer after a predetermined time period tB—from when output of the second control signal begins. As further shown in FIG. 7A, the integrated control section 52 may be provided with a pulse output pattern in which the cycle of the pulse of the second control signal is constant within a prescribed time period tA-tB.

FIG. 7B shows an example of movement speed of the socket board 20. In FIG. 7B, the horizontal axis corresponds to the time axis of FIG. 7A, and the vertical axis represents the movement speed of the socket board 20.

The integrated control section 52 outputs the second control signal based on the pulse output pattern shown in FIG. 7A, which thereby prevents the speed of the socket board 20 from changing quickly. Because of this, the impact on the socket board 20 and the test head 10 when the socket board 20 is attached or removed can be decreased.

As another example, the integrated control section 52 may control the pulse cycle of the second control signal based on the number of pulses in the output second control signal. In this case as well, the pulses of the second control signal can be output with a pulse output pattern such as that shown in FIG. 7A.

Figure 8:
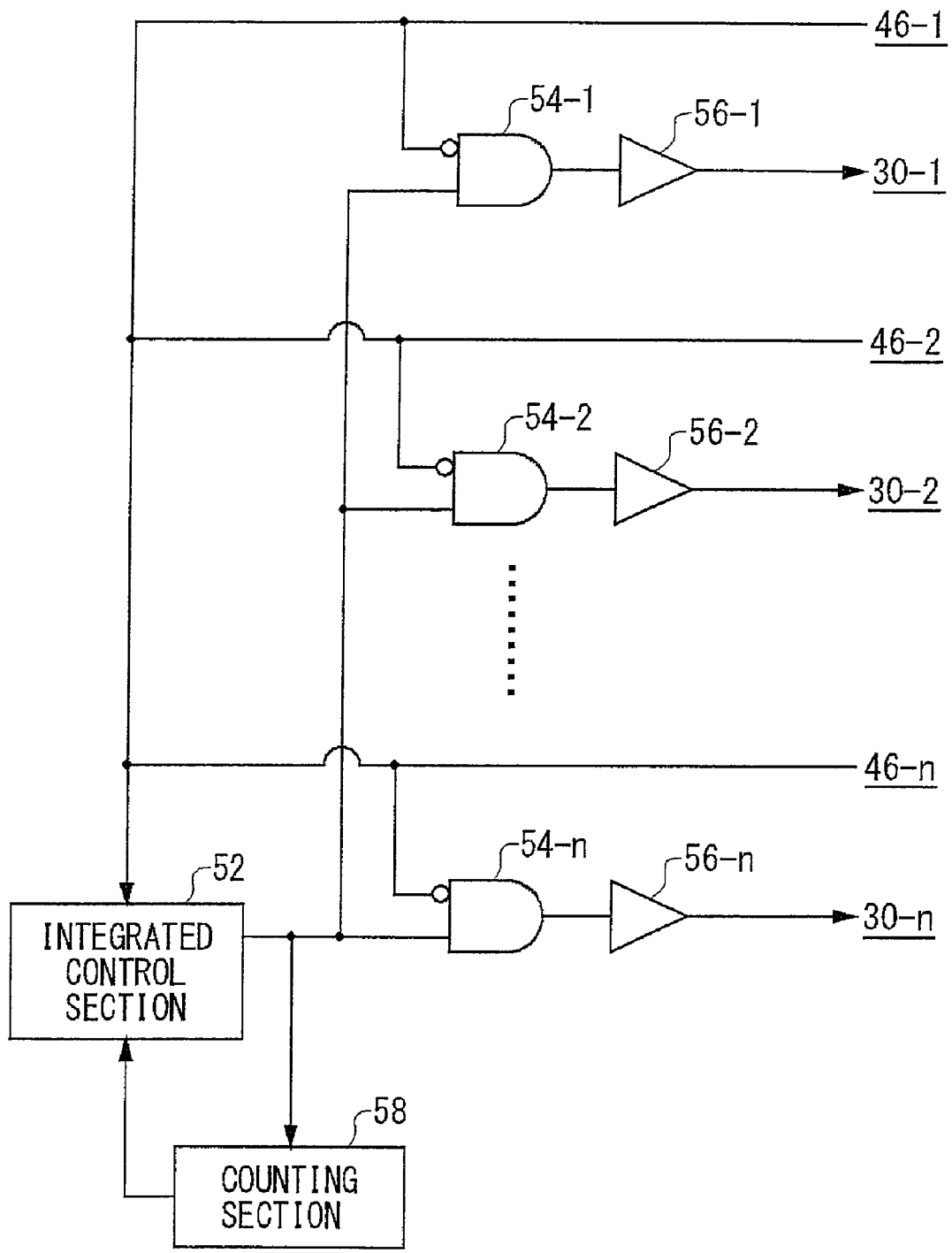
FIG. 8 shows another exemplary configuration of the connection control section 50.

FIG. 8 shows another exemplary configuration of the connection control section 50. The connection control section 50 of the present embodiment further includes a counting section 58 in addition to the configuration of the connection control section 50 shown in FIG. 4. Other structural elements may be the same as the structural elements given the same reference numerals in FIG. 4.

The counting section 58 counts the number of pulses of the second control signal output by the integrated control section 52. The integrated control section 52 controls the pulse cycle of the second control signal based on a count value obtained by the counting section 58.

For example, the integrated control section 52 may gradually shorten the pulse cycle of the second control signal until the count value by the counting section 58 reaches a first count value. The integrated control section 52 may hold the pulse cycle of the second control signal constant during a time period from when the count value by the counting section 58 reaches the first count value until when the count value reaches a second count value. The integrated control section 52 may gradually lengthen the pulse cycle of the second control signal during a time period from when the count value by the counting section 58 reaches the second count value until when the count value reaches a third count value.

The integrated control section 52 may stop outputting the second control signal when the count value by the counting section 58 becomes greater than a preset threshold value. By controlling the first through third count values, the threshold value, and the pulse cycle in each time period, the second control signal having the desired pulse output pattern can be generated. The integrated control section 52 may include an input section that receives setting information concerning the first through third count values, the threshold value, and the pulse cycle in each time period. The integrated control section 52 may calculate the threshold value by dividing the apparatus separation distance from the initial position to the connection position by the amount of change in the apparatus separation distance corresponding to a single pulse.

The integrated control section 52 may be supplied with a plurality of types of pulse output patterns. The integrated control section 52 may select one of the pulse output patterns to generate the second control signal. For example, the integrated control section 52 may be supplied with the plurality of types of pulse output patterns according to a plurality of different apparatus separation distances from the initial position to the connection position. The integrated control section 52 may be supplied with a plurality of pulse output patterns to be used when the apparatus separation distances from the initial position to the connection position are the same.

FIG. 9 shows examples of pulse output patterns supplied to the integrated control section 52. The plurality of pulse output patterns shown in FIG. 9 may be used when the apparatus separation distances from the initial position to the connection position are the same. In other words, the number of pulses in each pulse output pattern is the same.

The integrated control section 52 may switch the pulse output pattern to be used when the timing at which each position detecting section 46 detects that the connection position has been reached is different. For example, in a case where the pulse cycle is short, one of the actuators 30 might not be able to keep up with the pulse. When this happens, the apparatus separation distance corresponding to the aforementioned actuator 30 becomes different than the apparatus separation distances of the other actuators 30, so that the socket board 20 cannot be held horizontally.

To solve this problem, the integrated control section 52 may switch to using a pulse output pattern that causes the socket board 20 to move at a lower speed when the timing at which each position detecting section 46 detects that the connection position has been reached is different. For example, as shown by the middle pulse output pattern of FIG. 9, the integrated control section 52 may switch to a pulse output pattern that causes a lower movement speed during the constant speed, in other words, a pulse output pattern in which the cycle is larger in the region in which the pulse cycle is constant. As another example, as shown by the bottom pulse output pattern of FIG. 9, the integrated control section 52 may switch to a pulse output pattern in which the rate of acceleration and deceleration is lower.

When the socket board 20 is removed from the test head 10, the integrated control section 52 outputs a control signal to move each actuator 30 in a direction to increase the apparatus separation distance between the socket board 20 and the test head 10. At this time, each individual control section 54 may transmit the corresponding control signal. Furthermore, the integrated control section 52 may generate the control signal based on the pulse output pattern used when connecting the socket board 20 to the test head 10. For example, the integrated control section 52 may sequentially output the pulses that move the corresponding cam 32 a unit amount in the direction that increases the apparatus separation distance between the socket board 20 and the test head 10, according to the aforementioned pulse output pattern. The integrated control section 52 may select different pulse output patterns depending on whether the socket board 20 is being removed from the test head 10 or whether the socket board 20 is being connected to the test head 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus that tests a device under test, comprising:
   a test head that generates a test signal for testing the device under test;
   a socket board onto which is mounted the device under test, that transmits signals between the test head and the device under test;
   a plurality of actuators that are disposed on a lower surface of the socket board to correspond one-to-one with support positions thereof, and that each have a state thereof changed according to a control signal supplied thereto to independently move the corresponding support position in a direction vertical to the lower surface of the socket board; and
   a connection control section that independently supplies a first control signal to each actuator to set each actuator to be in the same state, and thereafter supplies commonly to each actuator a second control signal that gradually decreases an apparatus separation distance between the socket board and the test head.

2. A test apparatus that tests a device under test, comprising:
   a test head that generates a test signal for testing the device under test;
   a socket board onto which is mounted the device under test, that transmits signals between the test head and the device under test;
   a plurality of actuators that are disposed on a lower surface of the socket board to correspond one-to-one with support positions thereof, and that each have a state thereof changed according to a control signal supplied thereto to independently move the corresponding support position in a direction vertical to the lower surface of the socket board; and
   a connection control section that supplies a first control signal to each actuator to set each actuator to be in the same state, and thereafter supplies commonly to each actuator a second control signal that gradually decreases an apparatus separation distance between the socket board and the test head,
   wherein the connection control section includes:
      an integrated control section that generates the first control signal and the second control signal commonly for the actuators; and
      individual control sections that are disposed to correspond one-to-one with the plurality of actuators, and that stop the supply of the first control signal to the corresponding actuator when the state of the corresponding actuator becomes the same as a predetermined initial state.

3. The test apparatus according to claim 2, wherein the integrated control section supplies the second control signal commonly to all of the actuators on a condition that the state of all of the actuators is the same as the initial state.

4. The test apparatus according to claim 2, wherein each actuator includes:
   a moving section that is connected to the corresponding support position and that controls the apparatus separation distance between the corresponding support position and the test head by moving in a direction vertical to an upper surface of the test head;
   a cylinder whose state is changed according to the first control signal or the second control signal supplied thereto to move the moving section; and
   a position detecting section that detects whether the state of the corresponding cylinder is the same as the initial state, and the individual control section stops supplying the first control signal to the corresponding
   cylinder when the corresponding position detecting section detects that the
   cylinder is in the initial state.

5. The test apparatus according to claim 4, wherein each cylinder includes:
   a cam that moves in a horizontal direction in relation to the upper surface of the test head and that has a grooved portion formed thereon in which an end of the moving section slides; and
   a cam driving section that moves the cam according to the first control signal or the second control signal supplied thereto,
   wherein the cam includes:
      a first horizontal section whose grooved portion is formed in a region separated from the upper surface of the test head by a first separation distance and in a manner to extend horizontally in relation to the upper surface of the test head;

a second horizontal section whose grooved portion is formed in a region separated from the upper surface of the test head by a second separation distance and in a manner to extend horizontally in relation to the upper surface of the test head; and a junction section that connects the grooved portion formed in the first horizontal section and the grooved portion formed in the second horizontal section, and whose grooved portion is formed at an angle in relation to the upper surface of the test head.

6. The test apparatus according to claim 5, wherein the position detecting section detects whether a horizontal position of the cam is the same as an initial position designated by the initial state.

7. The test apparatus according to claim 6, wherein the initial position set in the position detecting section is within a positional range of the cam when one end of the moving section slides in the grooved portion of the junction section.

8. The test apparatus according to claim 5, wherein
the integrated control section sequentially outputs, as the first control signal or the second control signal, pulses that each change the position of the cam by a prescribed unit movement amount, each position detecting section outputs an initial state detection signal when the position of the corresponding moving section is the same as the initial position designated by the initial state, and each individual control section masks the pulses of the first control signal when the corresponding position detecting section outputs the initial state detection signal.

9. The test apparatus according to claim 8, wherein the integrated control section is supplied with a pulse output pattern of the second control signal that gradually increases a pulse cycle of the second control signal after a predetermined time has passed since the output of the second control signal, to output the pulses of the second control signal based on the pulse output pattern supplied thereto.

10. The test apparatus according to claim 9, wherein
each position detecting section further detects whether the position of the corresponding cam is the same as the connection position corresponding to the state in which the test head and the socket board are connected, and the integrated control section is provided with a plurality of types of pulse output patterns, and switches which pulse output pattern is used when the timing at which each position detecting section detects that the connection position has been reached is different.

11. The test apparatus according to claim 8, further comprising a counting section that counts a number of pulses of the second control signal output by the integrated control section, wherein the integrated control section gradually increases the pulse cycle of the second control signal when the count value by the counting section reaches a predetermined count value and outputs the thus achieved second control signal.

12. The test apparatus according to claim 8, wherein
each position detecting section further detects whether the position of the corresponding cam is the same as the connection position corresponding to the state in which the test head and the socket board are connected, and the integrated control section stops outputting the second control signal when all of the position detecting sections detect that the position of the corresponding moving section has reached the connection position.

13. The test apparatus according to claim 12, further comprising a counting section that counts a number of pulses of the second control signal output by the integrated control section, wherein the integrated control section stops outputting the second control signal when the count value by the counting section becomes greater than a predetermined threshold value.

14. A connecting apparatus that connects a first apparatus and a second apparatus, comprising:
a plurality of actuators that are disposed on a lower surface of the first apparatus to correspond one-to-one with support positions thereof, and that each have a state thereof changed according to a control signal supplied thereto to independently move the corresponding support position in a direction vertical to the lower surface of the first apparatus; and a connection control section that independently supplies a first control signal to each actuator to set each actuator to be in the same state, and thereafter supplies commonly to each actuator a second control signal that gradually decreases an apparatus separation distance between the first apparatus and the second apparatus.

15. The connecting apparatus according to claim 14, wherein the connection control section includes:
an integrated control section that generates the first control signal and the second control signal commonly for the actuators; and individual control sections that are disposed to correspond one-to-one with the plurality of actuators, and that stop the supply of the first control signal to the corresponding actuator when the state of the corresponding actuator becomes the same as a predetermined initial state.

16. The connecting apparatus according to claim 15, wherein the integrated control section supplies the second control signal commonly to all of the actuators on a condition that the state of all of the actuators is the same as the initial state.

17. The connecting apparatus according to claim 15, wherein each actuator includes:
a moving section that is connected to the corresponding support position and that controls the apparatus separation distance between the corresponding support position and the second apparatus by moving in a direction vertical to an upper surface of the second apparatus;

a cylinder whose state is changed according to the first control signal or the second control signal supplied thereto to move the moving section; and a position detecting section that detects whether the state of the corresponding cylinder is the same as the initial state, and the individual control section stops supplying the first control signal to the corresponding cylinder when the corresponding position detecting section detects that the cylinder is in the initial state.

18. The connecting apparatus according to claim 17, wherein each cylinder includes:
a cam that moves in a horizontal direction in relation to the upper surface of the second apparatus and that has a grooved portion formed thereon in which an end of the moving section slides; and a cam driving section that moves the cam according to the first control signal or the second control signal supplied thereto, wherein the cam includes:
a first horizontal section whose grooved portion is formed in a region separated from the upper surface of the second apparatus by a first separation distance and in a manner to extend horizontally in relation to the upper surface of the second apparatus;

a second horizontal section whose grooved portion is formed in a region separated from the upper surface of the second apparatus by a second separation distance and in a manner to extend horizontally in relation to the upper surface of the second apparatus; and a junction section that connects the grooved portion formed in the first horizontal section and the grooved portion formed in the second horizontal section, and whose grooved portion is formed at an angle in relation to the upper surface of the second apparatus.

19. The connecting apparatus according to claim 18, wherein the position detecting section detects whether a horizontal position of the cam is the same as an initial position designated by the initial state.

20. The connecting apparatus according to claim 19, wherein the initial position set in the position detecting section is within a positional range of the cam when one end of the moving section slides in the grooved portion of the junction section.

21. The connecting apparatus according to claim 18, wherein the integrated control section sequentially outputs, as the first control signal or the second control signal, pulses that each change the position of the cam by a prescribed unit movement amount, each position detecting section outputs an initial state detection signal when the position of the corresponding moving section is the same as the initial position designated by the initial state, and each individual control section masks the pulses of the first control signal when the corresponding position detecting section outputs the initial state detection signal.

22. The connecting apparatus according to claim 21, wherein the integrated control section is supplied with a pulse output pattern of the second control signal that gradually increases a pulse cycle of the second control signal after a predetermined time has passed since the output of the second control signal, to output the pulses of the second control signal based on the pulse output pattern supplied thereto.

23. The connecting apparatus according to claim 22, wherein each position detecting section further detects whether the position of the corresponding cam is the same as the connection position corresponding to the state in which the second apparatus and the first apparatus are connected, and the integrated control section is provided with a plurality of types of pulse output patterns, and switches which pulse output pattern is used when the timing at which each position detecting section detects that the connection position has been reached is different.

24. The connecting apparatus according to claim 21, further comprising a counting section that counts a number of pulses of the second control signal output by the integrated control section, wherein the integrated control section gradually increases the pulse cycle of the second control signal when the count value by the counting section reaches a predetermined count value and outputs the thus achieved second control signal.

25. The connecting apparatus according to claim 21, wherein each position detecting section further detects whether the position of the corresponding cam is the same as the connection position corresponding to the state in which the second apparatus and the first apparatus are connected, and the integrated control section stops outputting the second control signal when all of the position detecting sections detect that the position of the corresponding moving section has reached the connection position.

26. The connecting apparatus according to claim 25, further comprising a counting section that counts a number of pulses of the second control signal output by the integrated control section, wherein the integrated control section stops outputting the second control signal when the count value by the counting section becomes greater than a predetermined threshold value.

* * * * *